United States Patent [19]

Faris et al.

[11] Patent Number: 4,498,046
[45] Date of Patent: Feb. 5, 1985

[54] ROOM TEMPERATURE CRYOGENIC TEST INTERFACE

[75] Inventors: Sadeg M. Faris; Paul A. Moskowitz; Arthur Davidson, all of Yorktown Heights; George A. Sai-Halasz, Mt. Kisco, all of N.Y.

[73] Assignee: International Business Machines Corporation, Armonk, N.Y.

[21] Appl. No.: 434,770

[22] Filed: Oct. 18, 1982

[51] Int. Cl.³ .................... G01R 5/00; F25B 19/00
[52] U.S. Cl. .................... 324/158 F; 62/514 R; 333/99 S
[58] Field of Search .......... 324/158 F, 71.5, 71.6; 333/99 S; 62/514 R

[56] References Cited

U.S. PATENT DOCUMENTS

| 3,560,893 | 12/1968 | Wen | 333/24.1 |
| 4,328,530 | 5/1982 | Bajorek et al. | 361/308 |
| 4,328,531 | 5/1982 | Nagashima et al. | 361/401 |
| 4,401,900 | 8/1984 | Faris . | |
| 4,441,088 | 4/1984 | Anderson | 333/99 S X |

OTHER PUBLICATIONS

Hamilton, C. A., "High-Speed, Low-Crosstalk Chip Holder for Josephson Integrated Circuits", IEEE Transactions on Instr. & Meas., vol. IM-31, No. 2, Jun. 1982.

J. Claussy et al., "Easily Demountable Elastomer Seal for Cryogenic Applications," Cryogenics, vol. 18, No. 8, Aug. 1978, p. 501.

L. S. Shirshov et al., "1 kA Current Lead-Ins for Superconducting Solenoids Operating in Transportable Dewar Vessel," Instruments and Experimental Techniques, vol. 24, No. 5, Part 2, Sep.-Oct. 1981, pp. 1336-1338, Plenum Publishing Corporation, New York, U.S.

C. A. Hamilton et al., "Analog Measurement Applications for High Speed Josephson Switches," IEE Transactions on Magnetics, vol. Mag. 17, No. 1, Jan., 1981, pp. 577-582.

Primary Examiner—Stewart J. Levy
Assistant Examiner—S. Baker
Attorney, Agent, or Firm—Carl C. Kling

[57] ABSTRACT

This interface permits the testing of high speed semiconductor devices (room-temperature chips) by a Josephson junction sampling device (cryogenic chip) without intolerable loss of resolution. The interface comprises a quartz pass-through plug which includes a planar transmission line interconnecting a first chip station, where the cryogenic chip is mounted, and a second chip station, where the semiconductor chip to be tested is temporarily mounted. The pass-through plug has a cemented long half-cylindrical portion and short half-cylindrical portion. The long portion carries the planar transmission line, the ends of which form the first and second chip mounting stations. The short portion completes the cylinder with the long portion for part of its length, where a seal can be achieved, but does not extend over the chip mounting stations. Sealing is by epoxy cement. The pass-through plug is sealed in place in a flange mounted to the chamber wall. The first chip station, with the cryogenic chip attached, extends into the liquid helium reservoir. The second chip station is in the room temperature environment required for semiconductor operation. Proper semiconductor operating temperature is achieved by a heater wire and control thermocouple in the vicinity of each other and the second chip mounting station. Thermal isolation is maintained by vacuum and seals. Connections for power and control, for test result signals, for temperature control and heating, and for vacuum complete the test apparatus.

6 Claims, 9 Drawing Figures

FIG. 3A
FIG. 3B
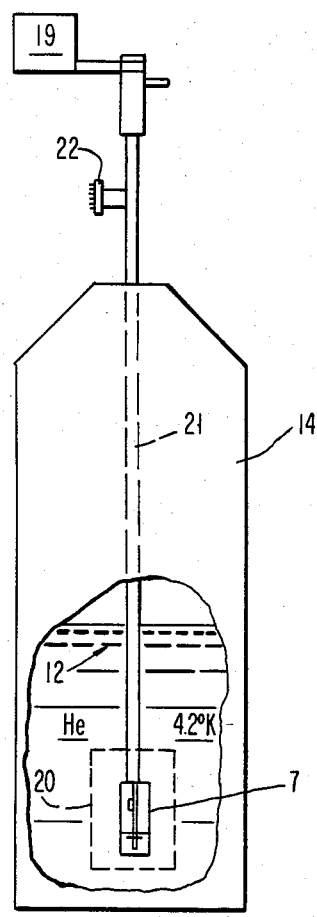
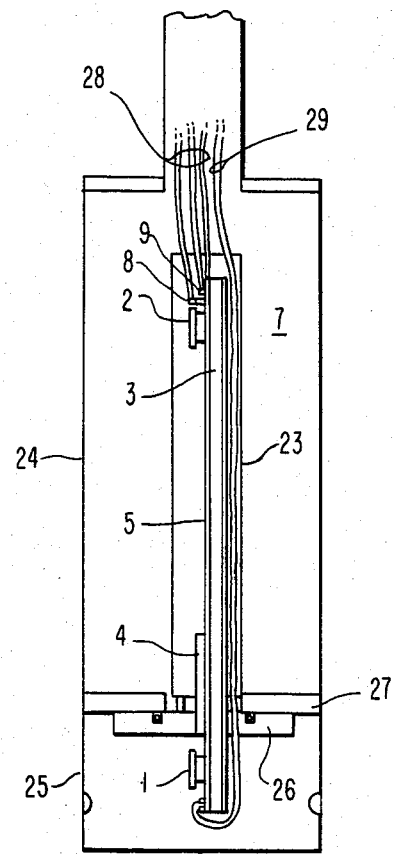

ROOM TEMPERATURE CRYOGENIC TEST INTERFACE

BACKGROUND OF THE INVENTION

1. Field of the Invention

The invention relates to test devices for extremely high speed electronic devices and chips, and specifically to a mechanism for providing a high quality electronic interface between a tester device which operates at cryogenic temperatures and a device or chip under test which operates at a higher ambient temperature.

2. Description of the Prior Art

U.S. Pat. No. 4,401,900, Faris, Ultra High Resolution Josephson Sampling Technique, dated Aug. 30, 1983, shows time resolution of 5 picoseconds and sensitivity of 10 $\mu$V. This was demonstrated experimentally using a cryogenic sampling system. The time resolution of this system is extendable to the sub-picosecond domain, limited ultimately by the intrinsic switching speed of the Josephson device used as the sampling gate. This can be as little as 0.09 picosecond in principle. This system is not restricted to measuring only fast waveforms produced in a cryogenic environment. Rather, it is extendable to general waveforms from various sources, such as X-rays or optical photons, if a suitable interface should be available.

It is also possible to measure electrical waveforms generated at room temperature, provided an adequate high performance interface scheme can be devised. In order to take advantage of the high resolution of 1 picosecond, the interface scheme has to satisfy the following constraints:

Frequency Constraint—A transmission line system for propagating the unknown signal from 300K to 4.2K with a 3 db cutoff frequency of 1000 GigaHertz is needed.

Transmission Line Length Constraint—The line has to be long enough, greater than about 3 cm, to allow for comfortable working space where the source of the unknown signal can be connected. The signal transmission line must pass through the outer dewar wall, through a vacuum region, through radiation shields, and through the inner dewar wall—and leave enough space for connecting the sampling chip which is immersed in liquid helium. Note that this constraint is in conflict with the frequency constraint which requires the length to be as short as possible.

Heat Loss Constraint—Heat loss, which is predominately caused by conduction through the high performance transmission line, must be minimized. This constraint is also in conflict with the frequency constraint. On the one hand, the line has to be short enough such that the attenuation is less than 3 dB at 1000 GigaHertz. On the other hand, we must maintain the smallest temperature gradient possible, which favors long lines. An optimum set of parameters exists which satisfies the above constraints.

Low Induction Constraint—In addition, picosecond resolution implies low inductance connections, on the order of 50 picohenries for a 50 ohm impedance system. This makes necessary the use of demountable connectors on the order of 100 $\mu$m or less in length. This has been beyond the state of the art until now.

In attempting to deal with these stringent requirements, earlier workers in the field (Hamilton et al, IEEE Transactions on Magnetics, MAG-17, pp 577-582, 1981) chose to insert a chip inside a coaxial line to couple the signals therethrough to the devices on the chip where the signal is eventually measured. Their arrangement is constrained to have large coaxial lines having high thermal conductivity and in order to avoid heat losses, the lines are constrained to be long. In addition, this line arrangement cannot be adapted easily to planar chips. Furthermore, their system is constrained to couple only one line to a chip, which limits the system in utility.

SUMMARY OF THE INVENTION

The invention is a high performance interface system which satisfies transmission line length requirements, heat loss requirements and low inductance requirements, allowing a room temperature signal to be faithfully measured with 1 picosecond precision. There are now room temperature devices which may not be adequately measured by any other technique. For instance, semiconducting transistors have been reported to have switching speeds as low as 17 picoseconds.

It is therefore the object of this invention to obtain a flexible, convenient interface system which satisfies the electrical, thermal and mechanical performance requirements for picosecond sampling.

It is another object of this invention to have a system capable of measuring signals generated from sources of variable temperature by means of the Faris "Ultra High Resolution Josephson Sampling Technique."

It is another object of this invention to render the sampling system useful for measuring switching speed of a room temperature device such as a silicon transistor or a high Tc superconductor, by means of a superconducting system at 4.2° K., without loss or degradation of the waveforms.

Yet another object of this invention is to have an interface system, capable of carrying signals on more than one transmission line which has planar geometry that can be compatible with a planar high performance sampling chip. The sampler chip must be maintained at or near liquid helium temperature (4.2K) while at the same time the chip under test is kept at room temperature (300° K.). The major problem is that of providing a low-loss, 1000 GHz bandwidth link between the two chips, while at the same time keeping heat transfer from the 300° K. environment to the 4.2° K. environment within a reasonable limit. There is a direct trade-off between heat transfer and response time for the transmission line, since good electrical conductance also implies poor thermal resistance. However, by making use of thin stripline structures, as described below, 1000 GHz response may be obtained while keeping helium boil-off at the acceptable level of a few liters per day from the cryostat.

The interface includes a pass-through liquid-helium-tight vacuum seal which consists of a flange and two half-cylindrical quartz portions. Quartz, while thermally non-conductive, forms a low loss dielectric substrate for the conductive copper striplines patterned on the flat surface of the longer portion. The coefficient of expansion of quartz is small and well matched to that of silicon used for Josephson and semiconductor chip substrates.

The two quartz portions of the pass-through plug are of differing lengths, arranged so that the half-cylinder portion with the copper striplines extend sufficiently beyond its mating half-cylinder portion to provide platforms for the semiconductor chip or device to be mounted at one end and the sampler chip to be mounted at the other end. The cylindrical geometry is chosen because it minimizes stress on the cement used to seal the pass-through. The planar nature of the striplines allows low inductance connections to be made directly to the sampler and semiconductor chips which are also planar. The low inductance contacts may be copper spheres or other rigid probes, about 100 μm in diameter or smaller, which penetrate solder pads on the chips when forced into contact by mechanical pressure. The pass-through is sealed with a thin layer of non-conductive cement and mounted in the wall of the cryostat with the sampler chip immersed in the liquid helium bath and the device or chip under test on the other side of the bulkhead maintained in vacuum at an elevated temperature. A heating element and thermocouple are placed near the position of the chip under test to warm the chip.

DESCRIPTION OF THE PREFERRED EMBODIMENT

Figure 1:
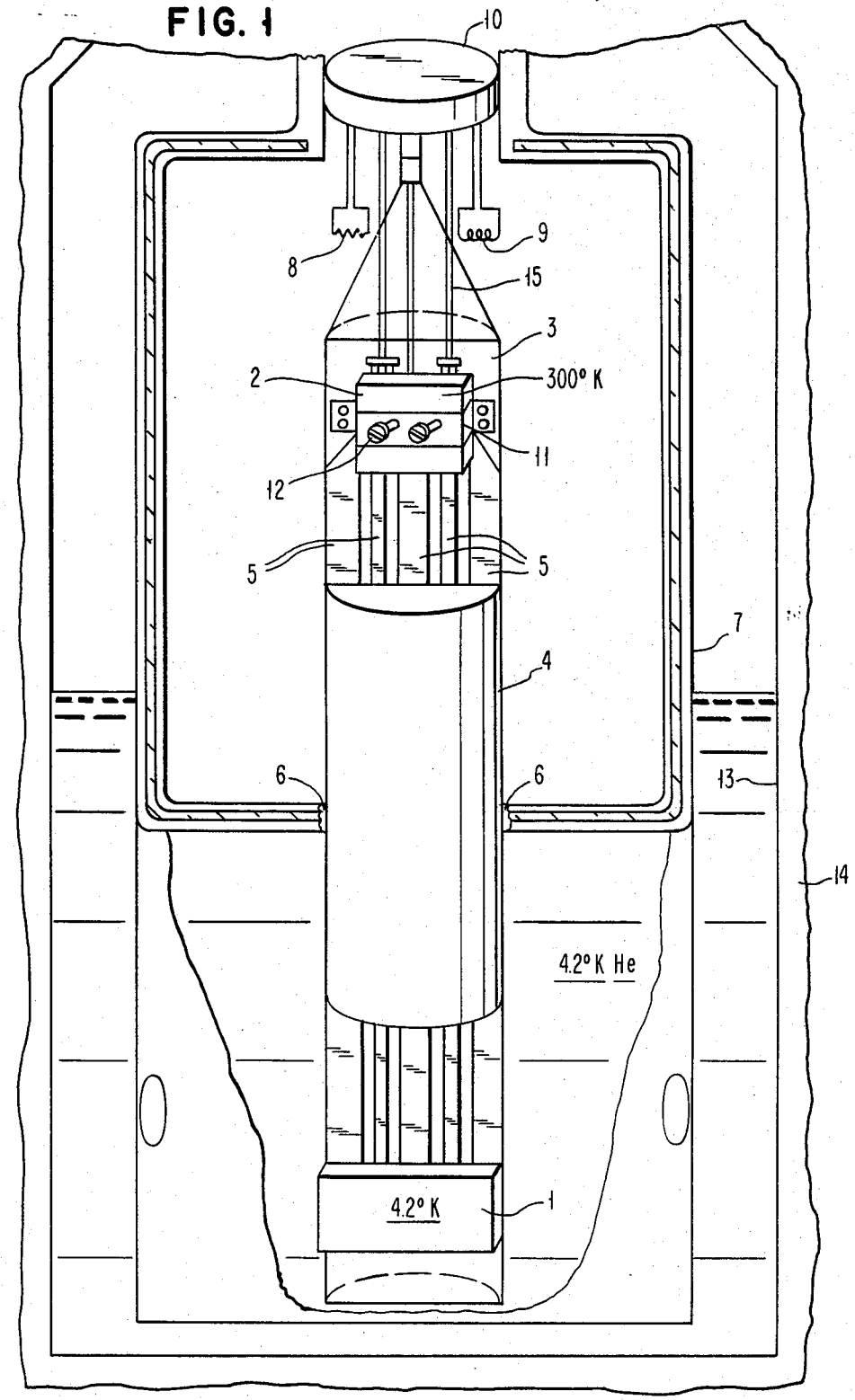
FIG. 1 is a partially cutaway diagram of the room temperature cryogenic test interface of the invention.

FIG. 1 illustrates the preferred embodiment. Sampler chip 1 and semiconductor chip 2 are mounted on long pass-through plug portion 3, which is sealed by short pass-through plug portion 4. Chips 1 and 2 are electrically connected by planar transmission lines 5.

The pass-through plug is sealed with epoxy cement and inserted through seal 6 into cryoinsert vehicle 7 (shown in cutaway) which is sealed and evacuated in actual operation.

Heater 8, thermocouple 9 and umbilical 10 (with vacuum, and with high quality electrical connections for both chips, for the heater and for the thermocouple) together with test chip mounting clip 11 and mounting clip screws 12 complete the package. As previously noted, the cryoinsert vehicle 7 is sealed, and it is inserted in the liquid helium within inner wall 13 of dewar 14. Connections 15 pass through an umbilical to display circuits and control circuits outside dewar 14.

In operation, semiconductor chip 2 is heated by heater resistor 8 to normal operating ambient temperature, as determined by thermocouple 9, and the test is carried out. Chips 1 and 2 are shown greatly enlarged to provide clarity. Heater 8 and thermocouple 9 are shown schematically and away from chip 2 when in operation they are positioned quite close. Chip 2 may be positioned by a pressure pad urged by mounting clip screws 12.

Figure 2:
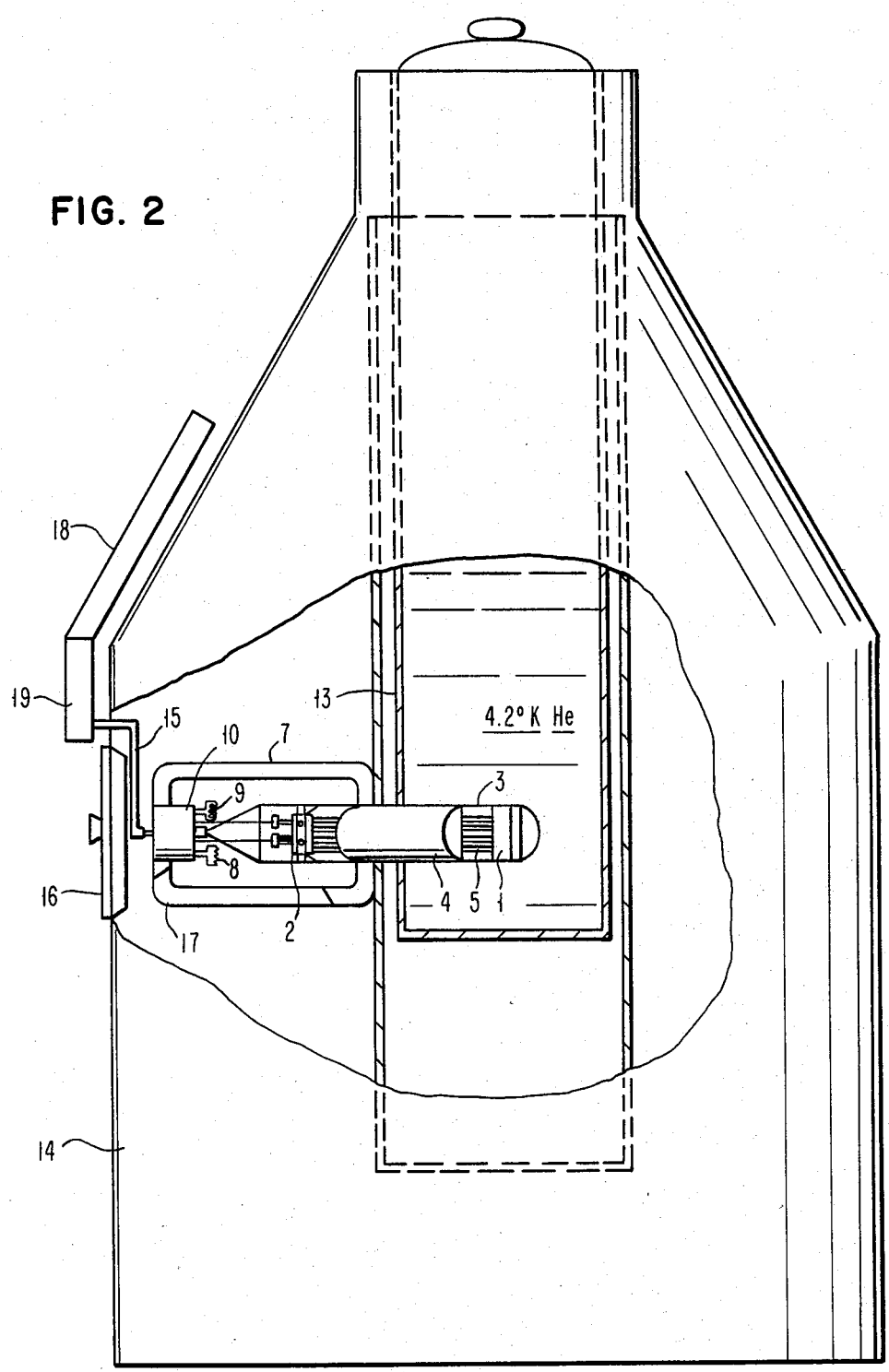
FIG. 2 is a partially cutaway diagram of the test interface in a different configuration for easier access in testing a number of test chips.

FIG. 2 illustrates a test interface arranged for quantity testing of semiconductor chips. There is no need to remove the sampler chip in order to replace the semiconductor chip with the next semiconductor chip to be tested.

The pass-through plug 3-4 with its planar transmission line 5 is not changed. Chamber 7 is mounted in juxtaposition to the liquid helium rather than immersed within the liquid helium—chamber 7 is permanently embedded in the insulated wall of dewar 14, with the pass-through in a wall of chamber 7 which forms a portion of inner dewar wall 13. The chamber has an access door 16 and a sealing hatch 17, and permanent connections 15 via the umbilical 10 to operating electronics and display 18 with appropriate control mechanisms 19. Operating signals through the umbilical provide controls for bringing semiconductor chip 2 to ambient operating temperature range and then operating it in its test mode. Various semi-automatic and automatic chip handling devices may be used to expedite delivery to the test station of the semiconductor chips to be tested; chamber 7 may be at atmospheric pressure and door 16 and hatch 17 may be eliminated in an automatic test situation.

Entry into the dewar may be from top, side or bottom as convenience demands, so long as the sampler chip remains in the liquid helium environment. For convenience of terminology, the test chamber for top entry is in this patent application termed "cryoinsert vehicle" and the test chamber for side or bottom entry is termed "barbette port".

FIGS. 3A and 3B illustrate details of the interface system, where the test chamber and the sampler are in the dashed line box (FIG. 3A inset 20) and are shown in more detail in FIG. 3B. The cryoinsert vehicle is carried on an umbilical tube 21, approximately 1 meter in length, having an I/O connector 22 and support mechanisms 19. The umbilical tube 21 is inserted in the dewar 14 with the test chamber and sampler immersed in liquid helium.

FIG. 3B gives more detail of the test chamber and sampler. Sampler chip 1 is below the surface of the liquid helium, while the chip 2 under test is contained in vacuum within the chamber of cryoinsert vehicle 7. Heater 8 keeps chip 2 at operating temperature, which is approximately above room temperature ($\geq 300K$). A long half-cylindrical quartz rod portion 3 provides support for the thin high-speed transmission line 5 connecting the chip under test 2 to the sampler chip 1. A short half-cylindrical quartz rod portion 4 mates with long half-cylindrical portion 3 to provide the vacuum pass-through. The lines 28 provide electrical connections for thermocouple 9 and heater 8. A heat shield 23 prevents thermal radiation to the outer vacuum chamber wall of cryoinsert vehicle 7.

Shielded transmission line 5 provides the I/O to the sampler chip 1. A protective shield 25, which is open to the liquid helium, is provided at the bottom of the cryoinsert vehicle. Flange 26 forms a vacuum seal with the bottom 27 of the vacuum chamber of cryoinsert vehicle 7. Shielded lines 29, which provide input and output connection to the sample, are permanently sealed to pass through flange 26.

DETAILED DESCRIPTION

Figure 3C:
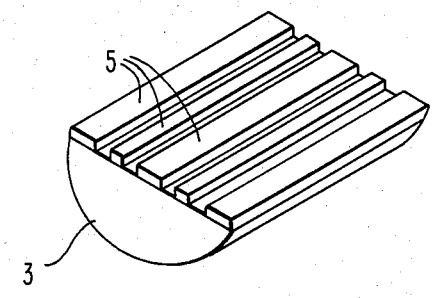
FIG. 3 (FIGS. 3A-3E) is a detail diagram of the test interface for testing of semiconductor chips.

FIG. 3C is a perspective view of a section of the long pass-through plug portion 3, which is comprised of polished quartz and a pattern of conductors 5 of copper.

Figure 3D:
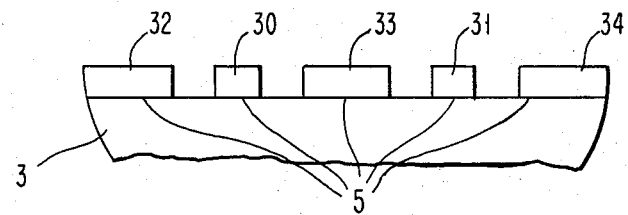

FIG. 3D is an expanded cross-section of the transmission lines on long pass-through plug portion 3. Narrow striplines 30 and 31 are the current carrying conductors, while ground striplnes 32, 33 and 34 complete the flat transmission lines. Only two transmission lines are shown; a suitable number of transmission lines may however be used.

Figure 3E:
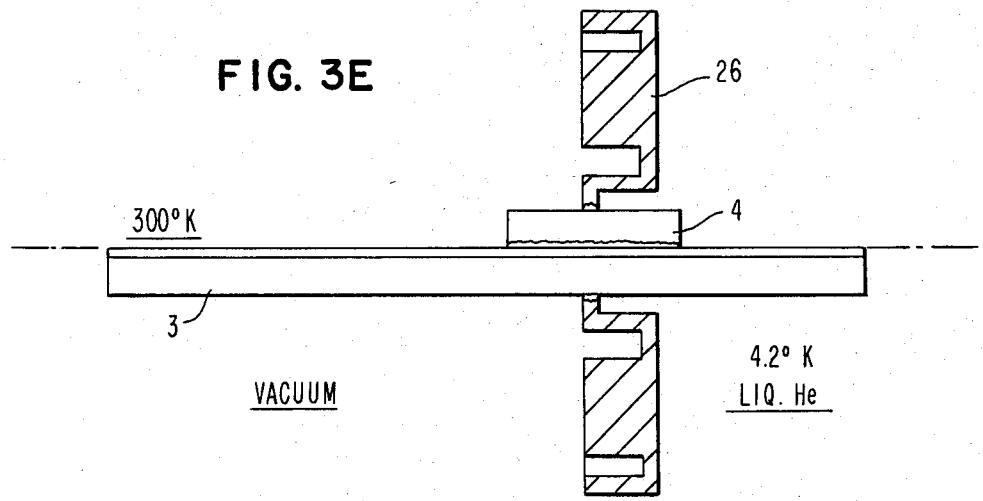

FIG. 3E shows the long pass-through plug portion 3 (with transmission line 5) cemented to short pass-through plug portion 4, forming a round quartz pass-through plug assembly. The assembly is cemented to flange 26 to form the liquid-helium-to-vacuum seal, shown schematically as seal 6 in FIG. 1.

The transmission lines can provide 1000 GHz bandwidth for a five centimeter line capable of 1 picosecond resolution. The pass-through plug provides low heat leakage and a good liquid-helium-to-vacuum-seal.

ALTERNATIVE EMBODIMENT

Figure 4A:
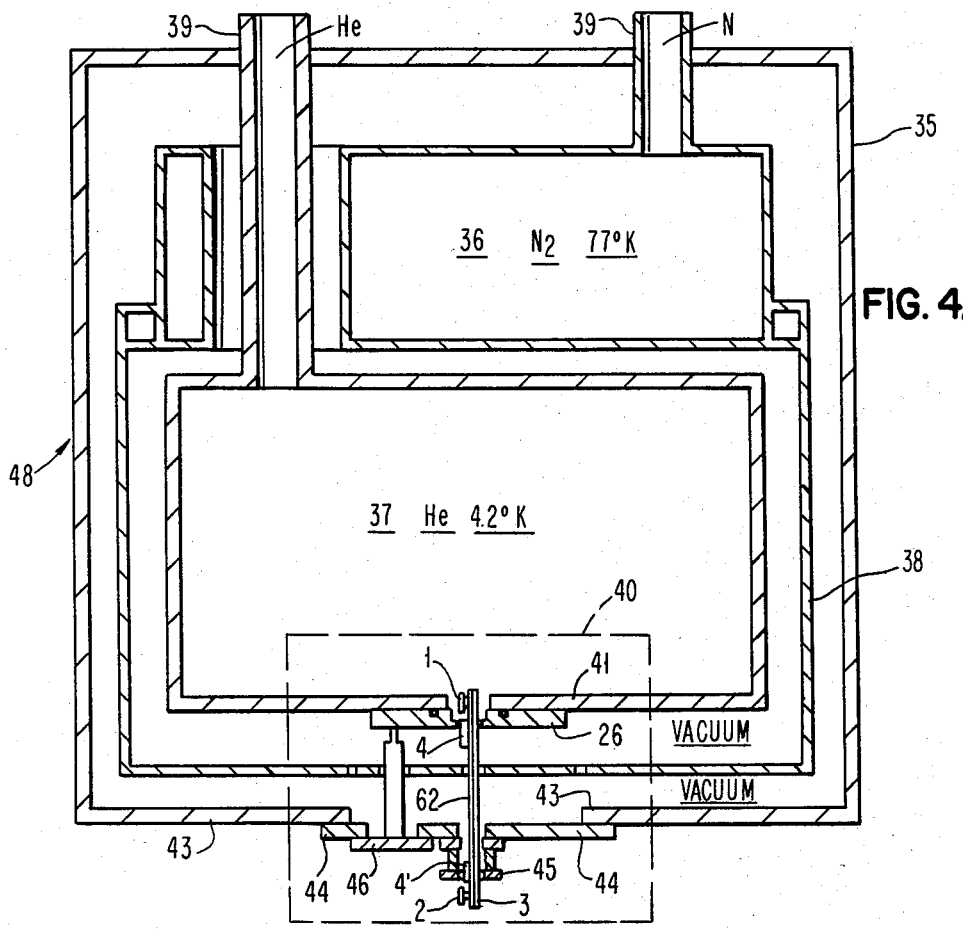
FIG. 4 (FIGS. 4A-4B) is a detail diagram of the test interface for testing semiconductor chips in quantity.
Figure 4B:
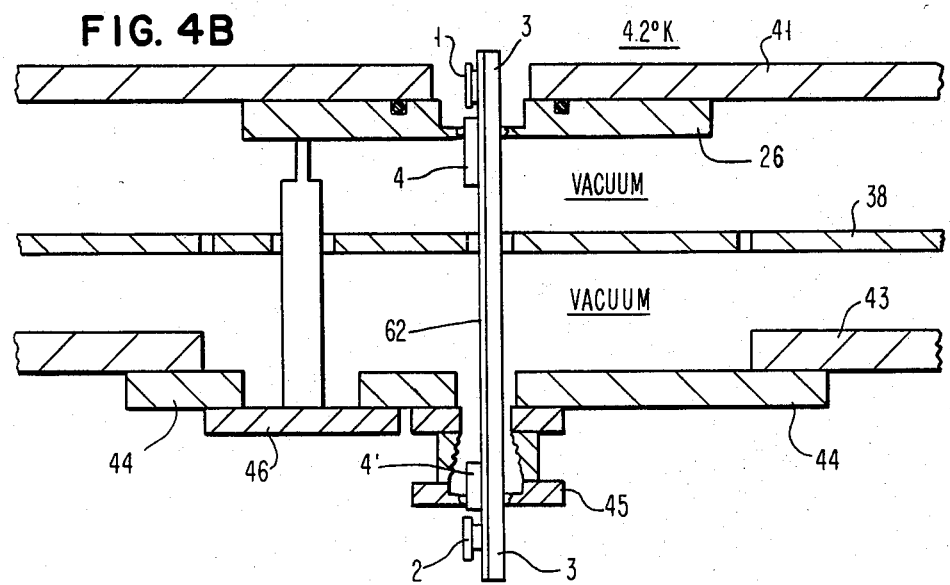

FIGS. 4A and 4B show a bottom barbette port dewar design and details of the vacuum seal. FIG. 4 shows a two-wall vacuum dewar 35, a liquid nitrogen reservoir 36, and a He reservoir 37. A 77° K. heat shield 38 is provided around reservoir 37. Fill supports 39 are provided to the dewar. The pass-through plug and seals (inset 40) complete the dewar, providing a sealed exit from dewar 35 through walls 41 and 43 of the dewar.

FIG. 4B is an expanded view of the apparatus of inset 40 of FIG. 4A. Dewar wall 43 makes contact with flange 44. The room temperature test chip 2 is attached to the pass-through plug 3-4, transmission line 5, on the other end of which is the Josephson sampler chip 1. Flange 45 and plug 46 seal the dewar vacuum chamber, with the pass-through plug having a second half cylindrical rod portion 4' at the sealing position.

The sampler chip is mounted in its own dewar. The advantage of this system is that any source of unknown signal located at room temperature can be tested without drawing the sampler chip from its cryogenic environment. Helium loss attributable to the interface package is small, while the dewar itself adds an even smaller amount. The liquid nitrogen cooled heat shield system nitrogen reservoir 37 protects the liquid helium reservoir from heat related helium loss.

The room temperature test chip may not require a souce of heat other than self-generated operating heat gain and ambient heat from room air.

What is claimed is:
1. A test device for a high speed ambient temperature range operating electronic device, having test operating electronics and display devices, a holder for the ambient temperature range operating electronic device, a cryogenic temperature operating sampling device and a holder for the cryogenic temperature operating sampling device in a cryogenic environment, the environment maintained by a dewar,—characterized by—
   (a) channel means forming an open pass-through channel between ambient temperature environment and cryogenic environment;
   (b) a pass-through plug having two portions complementary for part of the plug length for forming a removable pass-through plug which is operative to seal said channel means to maintain separation between the cryogenic environment and the ambient temperature range environment, which pass-through plug has first and second non-complementary extensions to serve as first and second chip mounting stations;
   (c) said pass-through plug having, on at least one of its portions, a planar transmission line of multiple conductors connecting said first chip mounting station to said second chip mounting station;
   (d) said pass-through plug having its complementary portions sealable by electrically insulating low heat transfer sealant;
   (e) plug sealing means associated with said complementary portions of said pass-through plug to provide a seal for the cryogenic environment with respect to the ambient environment;
   (f) electrical connecting means at said first station to connect a cryogenic-temperature-operating chip to said operating electronics and to said planar transmission line; and
   (g) electrical connecting means at said second station to connect an ambient temperature-operating chip temporarily to said operating electronics and to said planar transmission line.

2. A test device according to claim 1—further characterized in that—
   said multiple conductors (c) comprise multiple transmission lines having planar geometry for convenient connection to electrical means (f) and electrical connecting means (g).

3. A test device according to claim 1—further characterized by—
   (h) heating means, electrically connected to the operating electronics, and mechanically located proximate to said first chip mounting station;
   (i) temperature sensing means, electrically connected to the operating electronics, and mechanically located proximate to said first chip mounting station; and
   (j) temperature control means, included in the operating electronics, operatively connected to said heating means and to said temperature sensing means so as to control ambient temperature at said first station within operating range for the ambient temperature operating chip.

4. A test device according to claim 3—further characterized in that—
   said holder for the ambient temperature range operating electronic device is a barbette port—further characterized by—
   vacuum means operably connected to said barbette port, to produce in said barbette port a vacuum so as to minimize heat transfer.

5. A test device according to claim 3—further characterized in that—
   said holder for the ambient temperature range operating electronic device is a cryoinsert vehicle having a body of substantial strength with a sealable hatch, and—further characterized by—
   vacuum means connected via umbilical to said cryoinsert vehicle, to produce in said cryoinsert vehicle a vacuum so as to minimize heat transfer.

6. A test device according to claim 5 having an intermediate temperature reservoir in the dewar—further characterized by—
   a heat shield, contacting the intermediate temperature reservoir, mounted in said channel means substantially surrounding said pass-through plug.

* * * * *